United States Patent
Kanamori

(10) Patent No.: US 6,747,321 B2
(45) Date of Patent: Jun. 8, 2004

(54) SEMICONDUCTOR MEMORY DEVICE WITH A SILICIDE LAYER FORMED ON REGIONS OTHER THAN SOURCE REGIONS

(75) Inventor: Kohji Kanamori, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/024,122

(22) Filed: Dec. 17, 2001

(65) Prior Publication Data

US 2003/0111695 A1 Jun. 19, 2003

(51) Int. Cl.[7] ............................................. H01L 29/76
(52) U.S. Cl. ...................... 257/382; 257/315; 257/384; 257/768; 438/682
(58) Field of Search ......................... 257/315, 382, 257/383, 384, 754, 768, 773; 438/592, 618, 642, 649, 651, 655, 682

(56) References Cited

U.S. PATENT DOCUMENTS

| | | | | |
|---|---|---|---|---|
| 5,041,886 A | * | 8/1991 | Lee | 257/320 |
| 5,962,890 A | * | 10/1999 | Sato | 257/320 |
| 6,137,134 A | * | 10/2000 | Nakagawa | 257/316 |
| 6,281,076 B1 | * | 8/2001 | Choi et al. | 438/257 |

FOREIGN PATENT DOCUMENTS

| | | | |
|---|---|---|---|
| JP | 3-61-30063 | * 2/1986 | 257/316 |
| JP | 61-030063 | 2/1986 | |
| JP | 2000-243935 | 9/2000 | |
| KR | 1999-029183 | 4/1999 | |

OTHER PUBLICATIONS

Wolf., Silicon Processing for the VLSI Era vol. 2: Process Integration, 1990, Lattice Press, pp. 144–147.*

* cited by examiner

Primary Examiner—George Eckert
(74) Attorney, Agent, or Firm—Katten Muchin Zavis Rosenman

(57) ABSTRACT

In a semiconductor memory device including memory cells MC with MOS type structure comprising gate electrodes G and source regions S and drain regions D formed in both sides of the gate electrodes G formed on a semiconductor substrate, the source regions S comprise metal silicide layers 121 only in the source contact regions. Even if projected and recessed parts exist in the surface of the source regions S, since the metal silicide layers 121 are not formed on the projected and recessed parts, the metal silicide layers 121 are not disconnected in the projected and recessed parts, and the metal for forming the metal silicide layers 121 does not absorb silicon atom in the source regions S.

6 Claims, 14 Drawing Sheets

SEMICONDUCTOR MEMORY DEVICE WITH A SILICIDE LAYER FORMED ON REGIONS OTHER THAN SOURCE REGIONS

BACKGROUND OF THE INVENTION

1. Field of the Invention

The present invention relates to a semiconductor memory device and more paticularly to a semiconductor memory device including a salicide layer (a metal silicide layer formed by self-alignment) formed on a gate electrode, source and drain regions.

2. Description of a Related Art

A semiconductor memory device such as a flash memory has a memory cell which has a gate electrode and source and drain regions. As the memory device is integrated, a memory cell is made fine, resulting in its gate resistance and source and drain resistance increasing. It prevents to enhancing the operation speed. A metal suicide layer is therefore formed on a gate electrode and source and drain regions to lower the gate resistance and source and drain resistance.

FIG. 12 and FIGS. 13A to 13C illustrate a so-called NOR type memory cell of a related art. FIG. 12 is a plane layout view of the memory cell. FIGS. 13A to 13C are cross-sectional views along the AA line, the BB line, and the CC line of FIG. 12.

Gate electrodes G are extended in the row direction (in the right and left direction of the Figure) and arranged at prescribed intervals in the column direction (in the up and down direction of the Figure). Each gate electrode G is composed of a control gate CG as a word line in the row direction and an island-like floating gate FG formed under the control gate CG and corresponding to respective memory cells.

Impurity diffusion layers 202, 203 as source regions S and drain regions D are reciprocally arranged between gate electrodes G in the column direction. The source regions S are formed continuously in parallel to the gate electrodes G in the row direction. The drain regions D are isolated by an element isolating insulation film 204 arranged at prescribed intervals in the row direction. A gate electrode G and a pair of a source region S and a drain region D sandwiching the gate electrode D constitute one memory cell MC.

In such a memory cell MC, in order to increase the operation speed as described above, a metal silicide layer 221 using a refractory metal such as cobalt, titanium or the like is formed on the surface of the control gate CG, and on the surface of the source region S and the drain region D to lower their resistance values. Metals 233 as a source contact electrode SC and a drain contact electrode DC in contact holes 232 opened in an interlayer insulation film 231 are connected to the source region S and the drain region D through the metal silicide layer 221. Each drain contact electrode DC is arranged in the drain region D of each memory cell MC. Each source contact electrode SC is arranged in a region with a widened width formed by bending some parts of the neighboring gate electrodes G in the longitudinal direction toward the mutually opposed directions in the column direction. Each drain contact electrode DC is connected with a bit line BL as a wiring 234 on the interlayer insulating film 231. Each source contact electrode SC is connected with a power source line VSS as a wiring 235.

The source regions S are continuously arranged in the row direction. The source regions S are formed by removing element isolating insulation films 204 formed for dielectric isolation of respective drain regions of memory cells MC in source formation area and implanting an impurity in the silicon substrate 201 to form a high concentration impurity diffusion layer 202 of the source regions S. As illustrated in FIG. 13B, the surface of the silicon substrate 201 in the source regions S has recessed parts 205 formed by removal of the element isolating insulation film 204 and consequently, the source regions S has a surface considerably made uneven by the recessed parts 205.

In case where there exist sharply recessed parts 205 in the surface of the source regions S as described above, when a metal silicide layer 221 is formed as described above to lower the resistance of gate electrodes G, source regions S and drain regions D, the resistance of the source and drain regions SD is sometimes contrary increased.

FIG. 14 shows an enlarged cross and plane views of some part of a recessed part 205 formed on the surface of a source region S. When an element isolating insulation film 204 formed by LOCOS method for selectively oxidizing surface of a silicon substrate 201 is removed by etching, a bird's beak-like recessed part 205 with the depth of about 0.2 $\mu$m is formed in the surface of a source region. Especially, in end parts of the recessed part 205, steeply inclined faces are formed. For that, when a refractory metal 220 is formed by a sputtering method to form the metal silicide layer 221 on the surface of the source region S, the coverage with the refractory metal 220 is deteriorated in the end parts of the recessed part 205. In that case, the refractory metal 220 is not formed with a sufficient film thickness to cause a siliciding reaction with the silicon in the source region S or is not at all formed in the end parts. Consequently, when siliciding reaction is carried out thereafter, no metal silicide layer 221 may be formed on the surface of the recessed part 205 of the source region S. Further, since the refractory metal 220 absorbs silicon atoms Si of the source region S at the time of siliciding reaction of the refractory metal 220, silicon atom is decreased in the to decrease the conductivity of the silicon. As a result, the electric resistance of the formed source region S is consequently increased. Incidentally, if the refractory metal 220 is formed to be thick, such a problem can be solved. However, the siliciding reaction of the refractory metal 220 and the silicon substrate 201 becomes excessive and a silicide layer is formed to be partially deeper than the depth of a diffusion layer. That results in impossibility of PN junction formation.

BRIEF SUMMARY OF THE INVENTION

It is one of purpose of the invention is to lower the resistance of gate, source, drain, and source and drain contacts of a MOS type memory cell.

A semiconductor memory device of the present invention includes a plurality of non-volatile memory cells each having a source region, a source impurity diffusion layer divided into a first portion and a second portion extended from the first portion, a silicide layer formed on the second portion; and a source contact formed on the silicide layer. The first portion is the source regions of the memory cells so that no silicide film is formed on the first portion.

A semiconductor memory device of the present invention includes a first non-volatile memory cell having a first source region, a second non-volatile memory cell having a second source region, a source impurity diffusion layer divided into a first portion, a second portion and a third portion between the first and second portions, the first portion being the first source region and the second portion being the second source region, a silicide layer formed on the third portion and not formed on the first and second portions, and a source contact connected to said third portiong through said silicide layer.

A semiconductor memory device of the present invention includes a semiconductor substrate having a plurality of projected and recessed parts in the surface, a source region continuously formed on the projected and recessed parts of the semiconductor substrate to cover the projected and recessed parts, the source region running in a first direcion, an interlayer insulation film having an opening exposing a part of the surface of the source region so that no silicide layer is formed between the interlayer insulating film and the source region without the opening, and a metal silicide layer covering the opening of the source region.

In a semiconductor memory device of the invention, even if projected and recessed parts exist in the surface of source regions, since no metal silicide layer is formed on the projected and recessed parts, the metal silicide layer is not formed in disconnected state in the projected and recessed parts and the metal for forming the metal silicide layer does also not absorb silicon atom of the source regions to prevent increase of the electric resistance of the source regions. Further, on the other hand, since the metal silicide layer is formed in the regions where source contact electrodes are to be formed, the source contact resistance can be lowered.

Further, a fabrication method of a semiconductor memory device of the invention includes forming gate electrodes in the surface of a semiconductor substrate, forming source and drain regions in both sides of the gate electrodes, forming side walls by the side faces of the gate electrodes, and forming a metal silicide layer. In the step of forming the side walls, first side walls are formed on side faces of the gate electrodes and second side walls are formed with an insulatinfg film on the first side walls to expose said drain region and to cover source regions other than a source contact formation region.

According to the fabrication method of the invention, the source regions are buried with the insulation film by simply carrying out forming side walls only two times. It is made possible to easily fabricate a semiconductor memory device having no metal silicide layer in the source regions by a salicide formation step. Further, in the case of simultaneously forming memory cells and the peripheral circuits, if a side wall is formed only for the memory cells at the first time, the simultaneous formation can be performed by covering only the surface of the source regions with an insulation film by forming side walls at the second time simultaneously with the peripheral circuits after then. Consequently, only adding the step of forming the side walls only one time for the memory cells to the fabrication process of such a type of semiconductor memory device, a semiconductor memory device of the invention can easily be fabricated without changing the fabrication steps of a related method.

Incidentally, Japanese Patent Laid-Open No. 2000-243935 discloses a non-volatile semiconductor memory device in which no silicide layer is formed in source regions and a silicide layer is formed in drain regions. The drain regions has a low impurity concentration to form a Schottoky contact with a metal a metal silicide layer. The non-volatile semiconductor memory device has a structure where carriers transmitted through the Schottoky barrier are accelerated in an electric field applied to the metal silicide layer and injected and accumulated in floating gates.

BRIEF DESCRIPTION OF THE DRAWINGS

This above-mentioned and other objects, features and advantages of this invention will become more apparent by reference to the following detailed description of the invention taken in conjunction with the accompanying drawings, wherein:

FIG. 1A is a plane layout view of a semiconductor memory device of the invention and FIG. 1B is a circuit diagram of the device of FIG. 1A;

FIG. 4A to FIG. 4C are cross-sectional views along the AA line, the BB line, and the CC line in FIG. 1 and FIG. 4D is a cross-sectional view of a part of a peripheral circuit;

DETAILED DESCRIPTION OF THE PREFERRED EMBODIMENTS

Figure 1A:
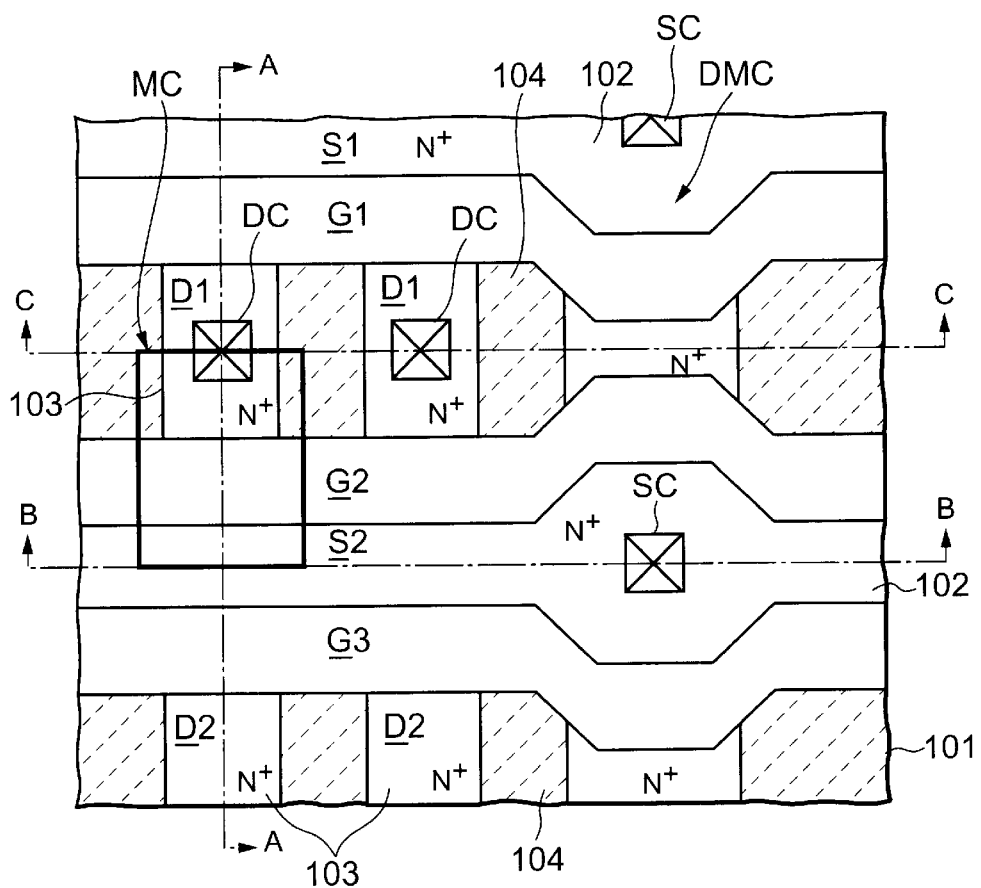
FIGS. 1A and 1B are views of a semiconductor memory device of an embodiment according to the invention.
Figure 1B:
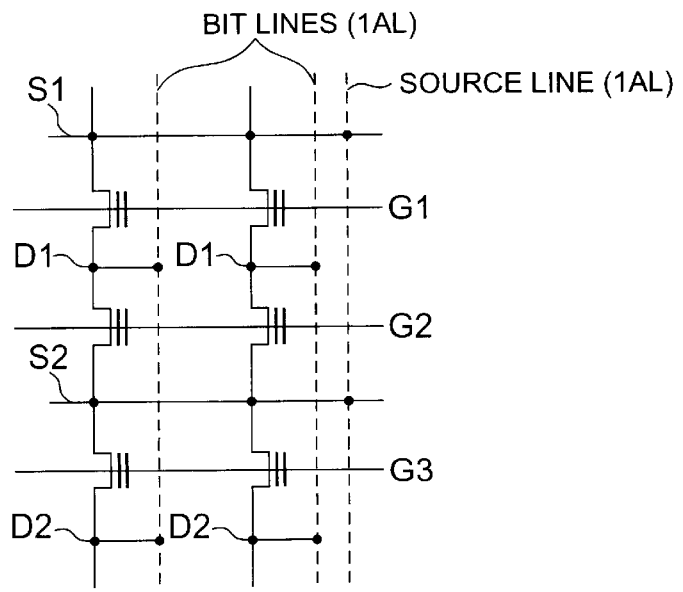
Figure 2A:
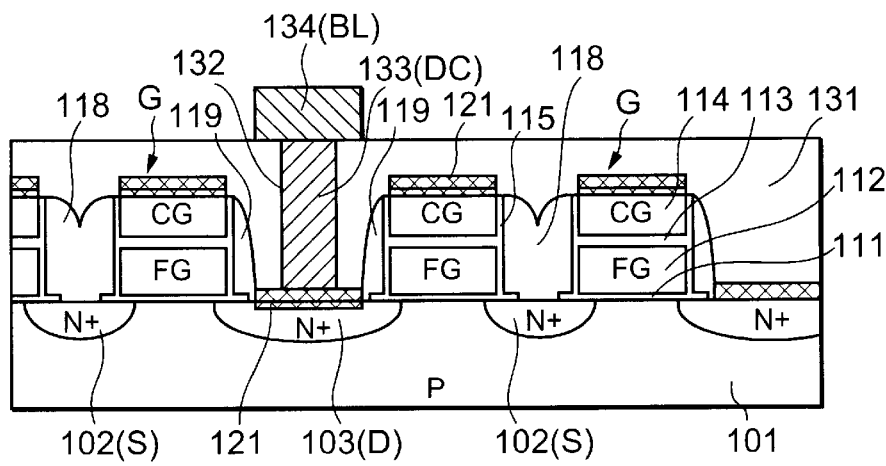
FIGS. 2A to 2C are cross-sectional views along the AA line, the BB line, and the CC line in FIG. 1A, respectively.
Figure 2B:
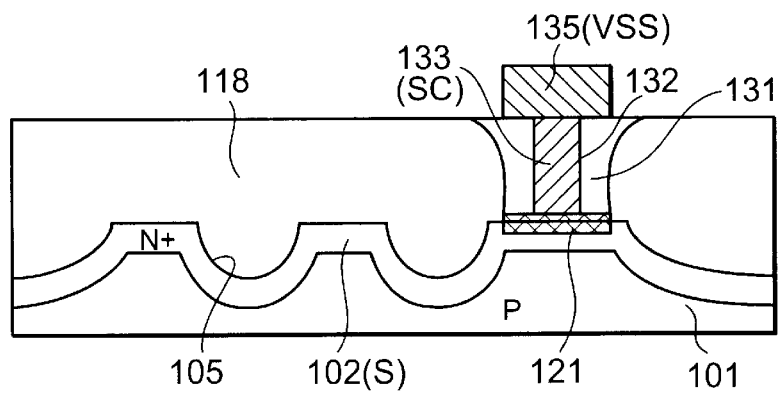
Figure 2C:
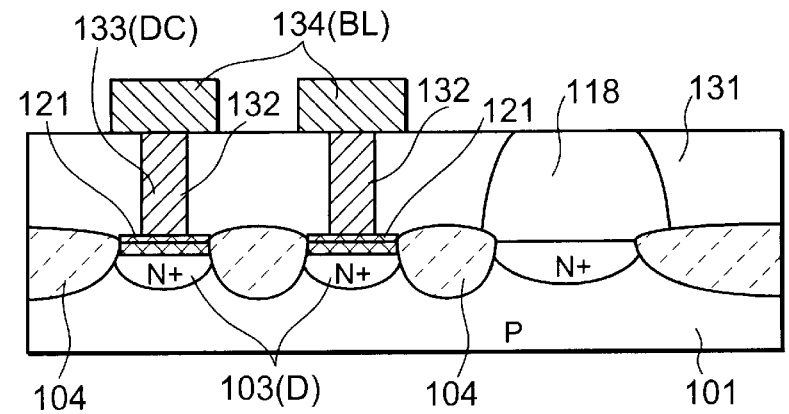

FIG. 1A is a plane layout of a non-volatile semiconductor memory device of an embodiment according to the invention. FIG. 1B is a circuit diagram of FIG. 1A. FIGS. 2A to 2C are cross-sectional views along the AA line, the BB line, and the CC line of FIG. 1A. In FIG. 1A, gate electrodes G1, G2 and G3 as word lines are extended in the row direction of the silicon substrate 101 and arranged at prescribed intervals in the column direction. Impurity diffusion layers 102, 103 as source regions S1, S2 and drain regions D1, D2 are reciprocally arranged between the neighboring gate electrodes G1, G2 and G3 in the column direction. For example, the width size of the gate electrodes G in the column direction, that is, the gate electrode length, is 0.25 to 0.3 μm and the size of the source regions S (102) in the column direction is approximately 0.2 μm, the size of the drain regions D (103) in the column direction is approximately two times, 0.4 μm, as wide as the size of the source regions S. The source regions S are formed continuously in parallel to the gate electrodes G in the row direction. The drain regions D are isolated in the row direction by an element isolating insulation film 104 arranged at prescribed intervals in the row direction. Drain contact electrodes DC are arranged respectively in respective drain regions D. As being surrounded with a two-point-dotted line in FIG. 1A, one gate electrode G2 and a pair of a source region S2 and a drain region D1 constitute one memory cell MC. Dummy memory cells DMC to be utilized as source contact regions are formed at place where some parts of mutually neighboring gate electrode D in the longitudinal direction are bent in directions parting from each other in the column direction. Source contact electrodes SC are arranged in the source regions S at widened area between adjacent gate electrodes. Source line VSS (not shown in FIG. 1A) is connected to source regions via source contact electrodes SC. Bit lines BL (not shown in FIG. 1A) are connected to drain regions via drain contact electrodes. Though not shown, the source and drain regions and the gate electrodes further extend in right direction. At the extended portion, a plurality of memory cells are arranged in the same way to the memory cells shown so that in the row direction, the same layout pattern of gate electrodes and source and drain regions etc shown in FIG. 1A is repeated.

As shown in FIGS. 2A to 2C, a tunnel insulation film 111 of a thermal oxidation film is formed on the surface of a silicon substrate 101. A floating gate FG of a first polysilicon 112 is formed on the tunnel insulation film 111 like islands. An inter-gate insulation film 113 of an oxide film/a nitride film/an oxide film, so called ONO film is formed on the floating gate FG. A control gate CG of a second polysilicon 114 formed on the inter-gate insulation film 113 and extended in the line direction. A thin thermal oxidation film 115 is formed in both side faces of the gate electrodes G. Side walls 119 of an insulation film of a CVD oxide film are formed on the film 115. A CVD oxide film 118 is formed in the source region S to cover the entire surface of the source regions S. A cobalt silicide layer 121 is formed respectively on the entire surface of the upper face of the control gates CG, the regions surrounded with the side walls 119 in the drain regions D, and the regions where the source contact electrodes SC of the source region S are arranged.

Figure 3:
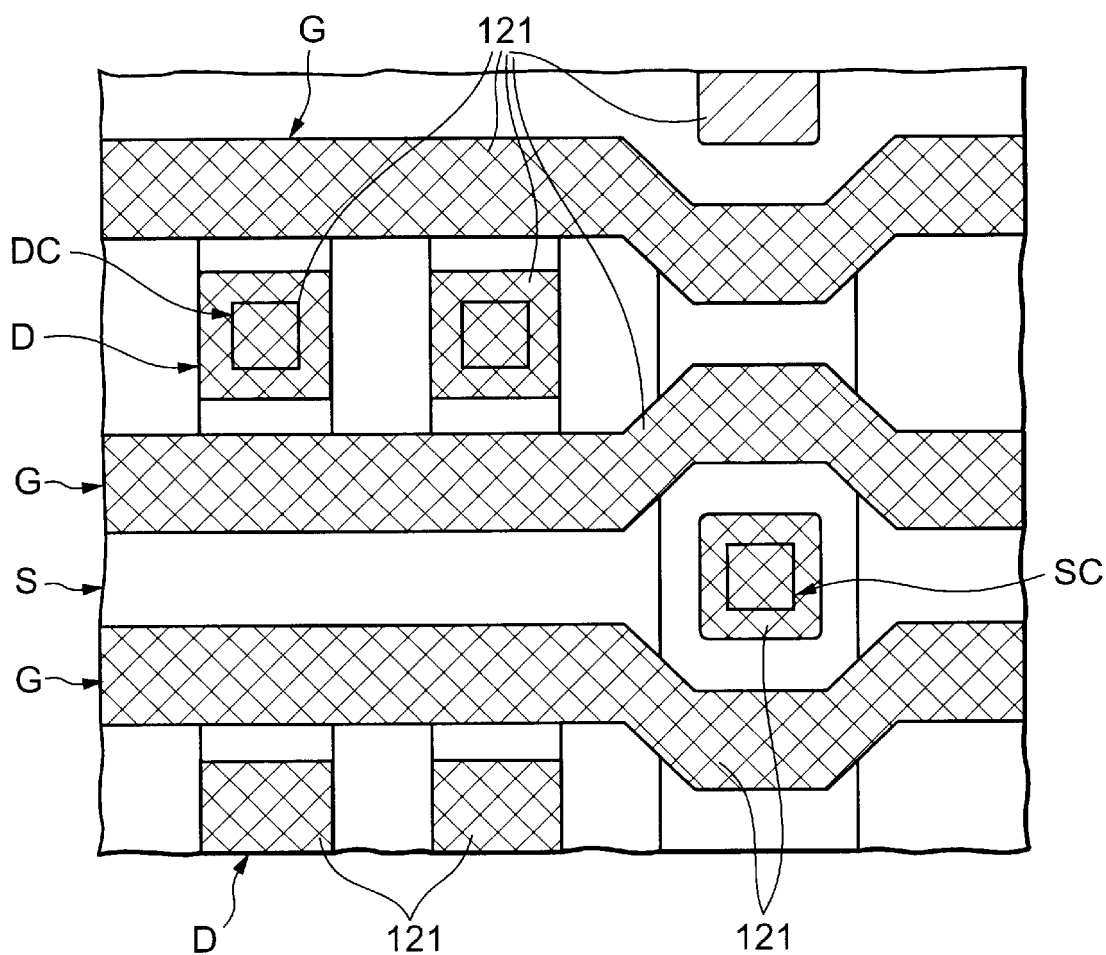
FIG. 3 is a plane pattern view of a silicide layer of FIG. 1.
Figure 4A:
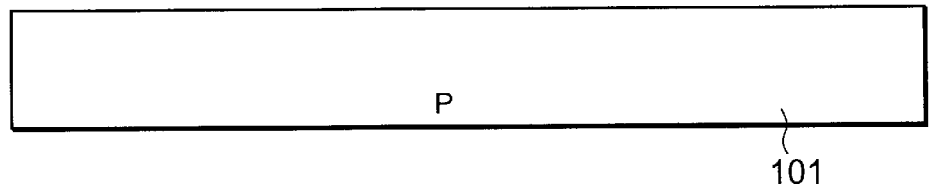
FIGS. 4A to 4D are cross-sectional views of a first process of a fabrication method of an embodiment according to the invention.
Figure 4B:
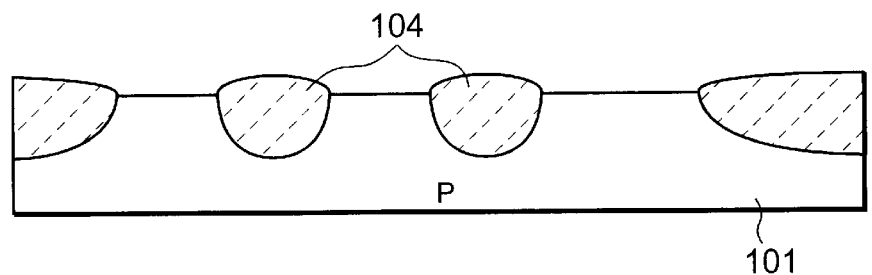
Figure 4C:
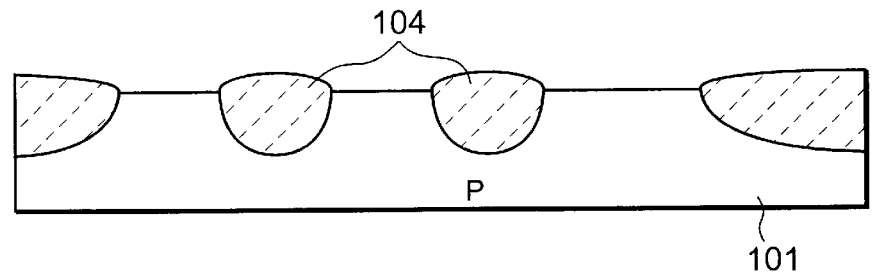
Figure 4D:
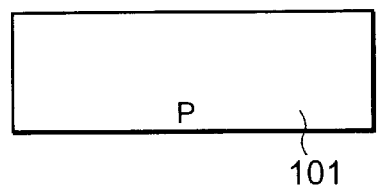
Figure 5A:
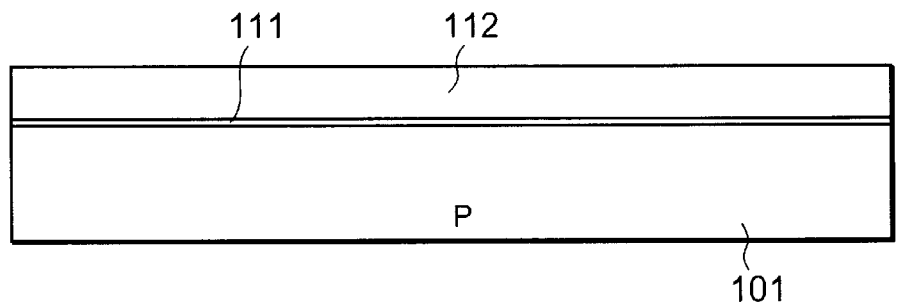
FIGS. 5A to 5D are cross-sectional views of a second process of a fabrication method of an embodiment according to the invention.
Figure 5B:
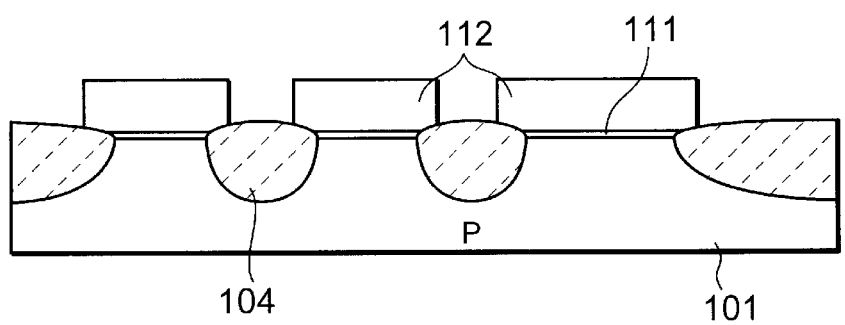
Figure 5C:
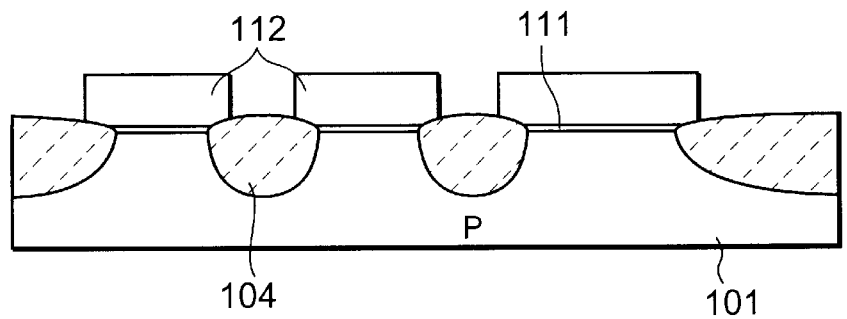
Figure 5D:
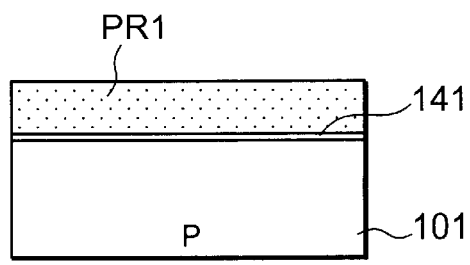

The drain regions D are partitioned by an element isolating insulation film 104 of a thick oxide film formed by LOCOS method on the silicon substrate 101. Regions exposed between side walls 119 in the drain region D are coated with a cobalt silicide 121. On the other hand, in the source regions S, recessed parts 105 as traces of the removal of the element isolating insulation film 104 exist in the surface of the source regions S. Surface of the source regions S is not coated with the cobalt silicide layer 121. The parts where the source contact electrodes SC are to be formed are selectively coated with the cobalt silicide layer 121. FIG. 3 shows the regions where the cobalt silicide layer 121 is formed corresponding to these in FIG. 1A.

An interlayer insulation film 131 is formed on the entire surface. As shown in FIG. 1A, contact holes 132 reaching the cobalt silicide layer 121 are opened respectively in the drain regions D of memory cells MC and source regions S where bending gate electrodes G are bended. A conductive material 133 is buried in the contact holes 132 to form the drain contact electrodes DC and source contact electrodes SC. Wiring 134 as a bit line BL is connected with the drain contact electrode DC. Wiring 135 as a power source VSS is connected with the source contact electrodes SC.

As described above, in the non-volatile semiconductor memory device of an embodiment according to the invention, since the cobalt silicide layer 121 is formed on the surface of the control gates CG of the memory cells MC made of polysilicon and the surface of the drain regions D, the gate resistance and the drain resistance can be lowered. Further, the drain contact resistance can be lowered. On the other hand, the cobalt silicide layer 121 is not formed on the surface of the source regions S, especially on the surface of the recessed parts 105 which becomes traces after removal of the element isolating insulation film 104 by etching. The increase of the source resistance can be prevented due to the discontinuous silicide layer. Further, since the source contact electrode SC are electrically connected with the source regions S through the cobalt silicide layer 121, the source contact resistance can be lowered.

Next, the fabrication method of the above-described non-volatile semiconductor memory device will be described with the reference to FIG. 4 to FIG. 11. FIGS. A to C are cross-sectional views corresponding to those of FIGS. 2A to 2C. FIG. D show the cross-sectional views of an LDD type MOS transistor formed in a peripheral circuit which is not shown in FIG. 1A.

As shown in FIGS. 4A to 4D, a first conductive type silicon substrate, for example, the surface of a p-type silicon substrate 101 is selectively oxidized by LOCOS method to form a plurality of element isolating insulation films 104 with a prescribed width and extended in the column direction at prescribed intervals in the 1 row direction. Then, as shown in FIGS. 5A to 5D, a tunnel insulation film 111 is formed with thickness of about 8 to 11 nm by thermal oxidation of the surface of the silicon substrate 101. A first polysilicon 112 is grown about 150 nm in the thickness thereon. The first polysilicon 112 is selectively etched by photolithographic technique using a photoresist (not shown) to be formed in a pattern composed of a plurality of lines extended in the column direction at prescribed intervals in the row direction so as to be left on active regions sandwiched between neighboring element isolating insulation films 104. In peripheral circuits, element isolating insulation films are formed (not shown) and the gate insulation layers 141 are formed and coated with a photoresist PR1 during the steps for memory cell formation.

Figure 6A:
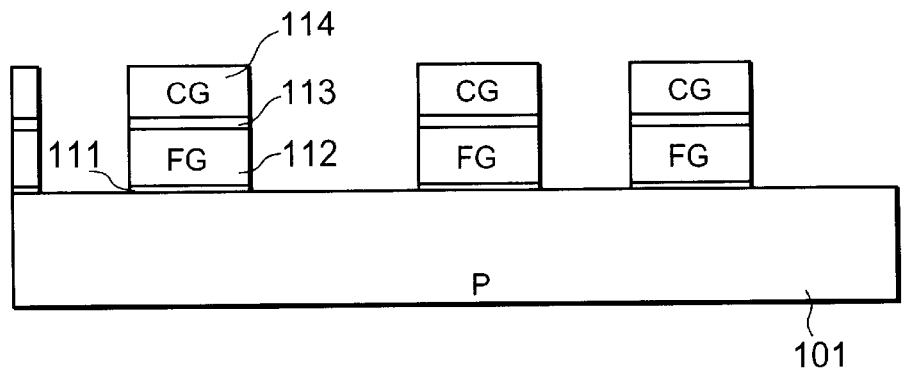
FIGS. 6A to 6D are cross-sectional views of a third process of a fabrication method of an embodiment according to the invention.
Figure 6B:
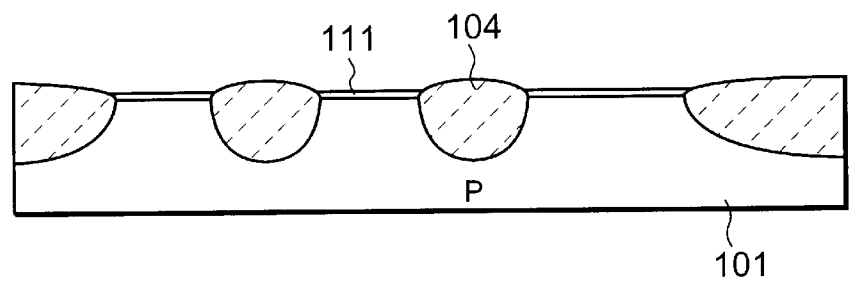
Figure 6C:
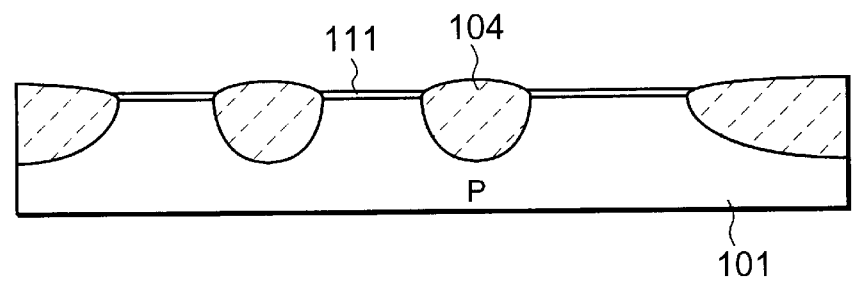
Figure 6D:
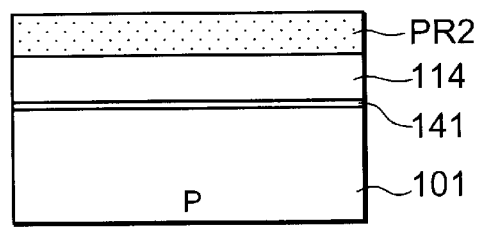
Figure 7A:
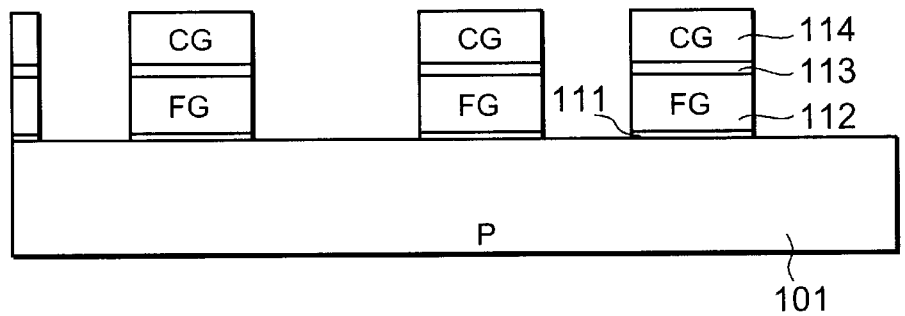
FIGS. 7A to 7D are cross-sectional views of a fourth process of a fabrication method of an embodiment according to the invention.
Figure 7B:
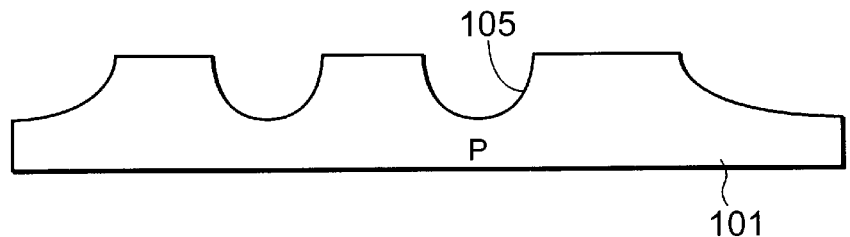
Figure 7C:
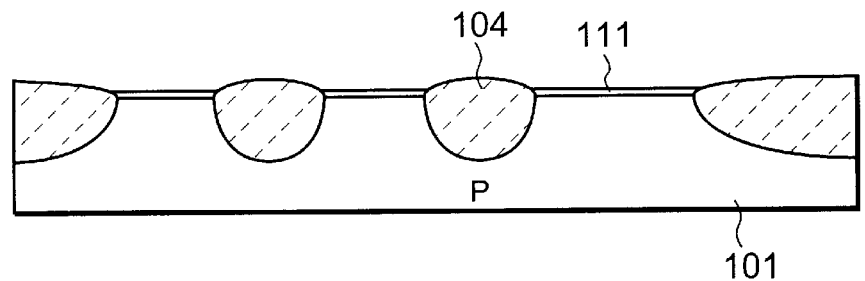
Figure 7D:
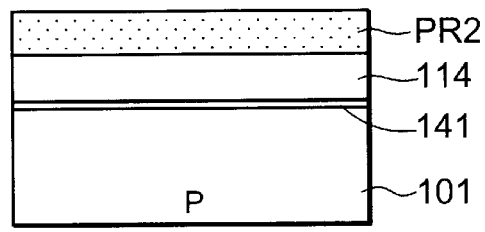
Figure 8A:
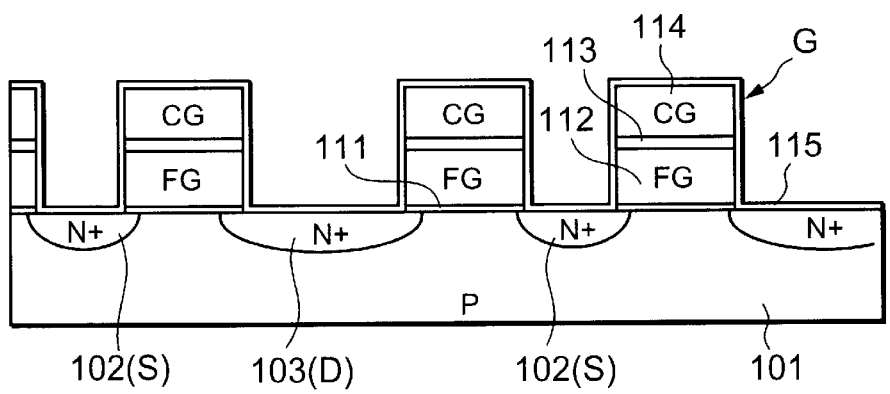
FIGS. 8A to 8D are cross-sectional views of a fifth process of a fabrication method of an embodiment according to the invention.
Figure 8B:
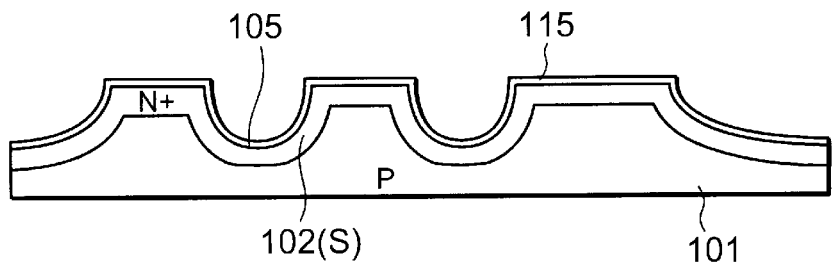
Figure 8C:
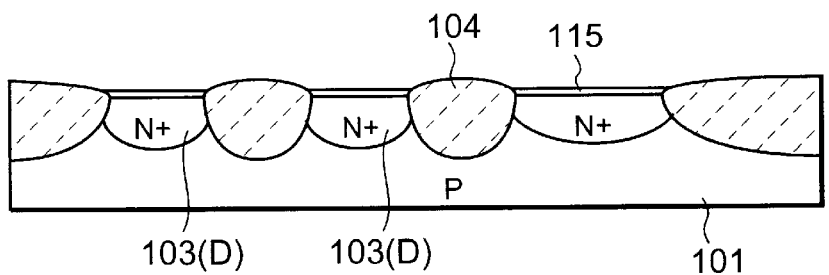
Figure 8D:
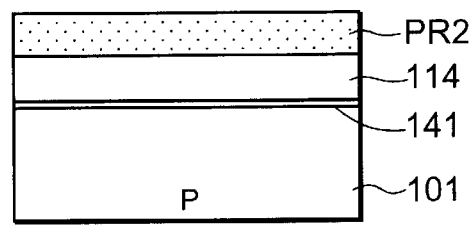

Next, as shown in FIGS. 6A to 6D, an inter-gate insulation film 113 made of an ONO film with the film thickness of 20 nm composed by layering an oxide film, a nitride film, and an oxide film respectively having the film thickness of 6 nm, 6 nm, and 8 nm, respectively is formed as to cover the surface of the patterned first polysilicon. A second polysilicon 114 with thickness of about 150 nm is grown thereon. At that time, as shown in FIG. 6D, in the peripheral circuits, the second polysilicon 114 is simultaneously grown on the gate insulation films 141 formed on the surface of the silicon substrate 101 and coated with a photoresist PR2. In the memory cell MC, the second polysilicon 114 is patterned in a plurality of lines extended in the column direction at prescribed intervals in the row direction by photolithographic technique using a photoresist (not shown). Further, along the patterned second polysilicon 114, the inter-gate insulation film 113 and the first polysilicon 112 are selectively etched. Consequently, control gates CG extended in the row direction are formed using the second polysilicon 114 and floating gates FG are formed using the first polysilicon 112 as an under layer of the control gates CG and separated in island-like state. As being shown in FIG. 1A, the gate electrodes G is so formed as to make the width size of the regions to be drain regions D in the column direction wider than that of the regions to be source regions S, in this case two times as wide. On the other hand, in the regions where dummy memory cell DMC are to be formed, some parts of the gate electrodes G in the longitudinal direction are formed while being bent in the column direction to make the width size of the regions to be the source regions S wider than the width size of the regions to be the drain regions D.

Next, as shown in FIGS. 7A to 7D, every the other region formed between neighboring gate electrodes G in the column direction, that is, each region to be drain regions D, is coated with a photoresist (not shown) and the regions to be source regions S are left exposed. After that, using the photoresist as a mask, the element isolating insulation films 104 exposed in the source regions S are removed by etching. Consequently, in the source regions S, recessed parts 105 with the depth of approximately 200 nm and having bird's beak-like cross-section are formed at prescribed intervals in the line direction as traces of removal of the element isolating insulation films 104.

Next, as shown in FIGS. 8A to 8D, the surface of the floating gates FG and the control gates CG composing the gate electrodes G is thermally oxidized to form thermal oxidation films 115 with the film thickness of approximately 5 to 10 nm. Further, nitride films with the film thickness of approximately 10 to 20 nm may be formed on the surface of the thermal oxidation films 115. Then, by self-alignment method utilizing the gate electrode G and the element isolating insulation films 104, an n-type impurity such as arsenic is ion-implanted in the silicon substrate 101 to form impurity diffusion layers 102, 103. Consequently, in the regions between neighboring gate electrodes G in the column direction, the drain regions D are formed to be isolated by the element isolating insulation films 104 in the line direction. In the same way, the source regions S are formed continuos in the row direction.

Next, as shown in FIGS. 9A to 9D, a first CVD oxide film 116 is grown approximately 0.12 $\mu$m in the thickness by CVD method as to cover the gate electrodes G, the source region S, and the drain regions D and then, the grown first CVD oxide film 116 is etched back to form first side walls 117 by both side faces of gate electrodes in the column direction. In this case, since the width size of the source regions S in the column direction is approximately ½ of the width size of the drain electrodes D in the same direction as described above, the interval size sandwiched between the respective first side walls 117 formed on the opposite to each other of the neighboring gate electrodes is made narrow as compared with the interval size of the drain regions D.

Figure 9A:
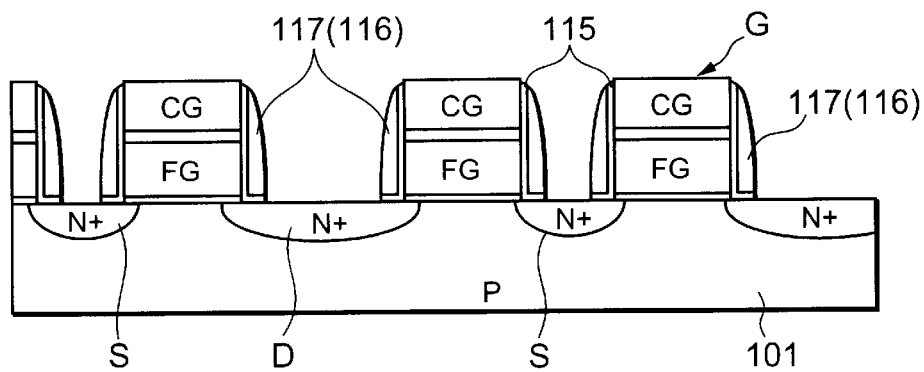
FIGS. 9A to 9D are cross-sectional views of a sixth process of a fabrication method of an embodiment according to the invention.
Figure 9B:
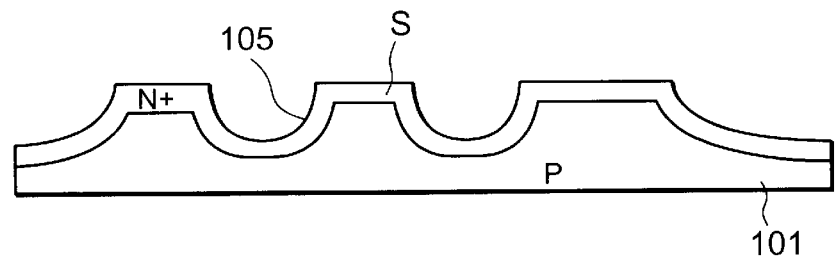
Figure 9C:
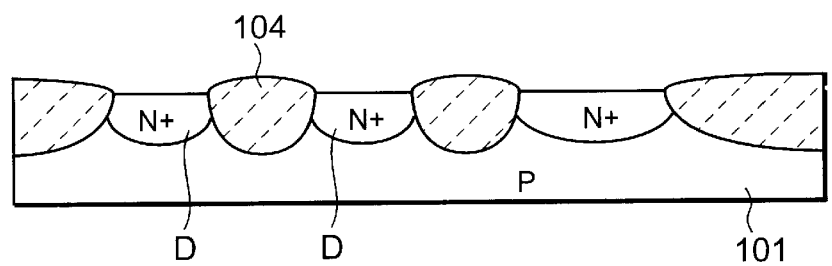
Figure 9D:
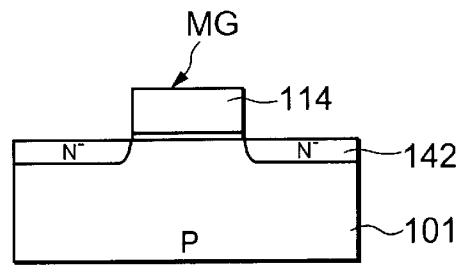
Figure 10A:
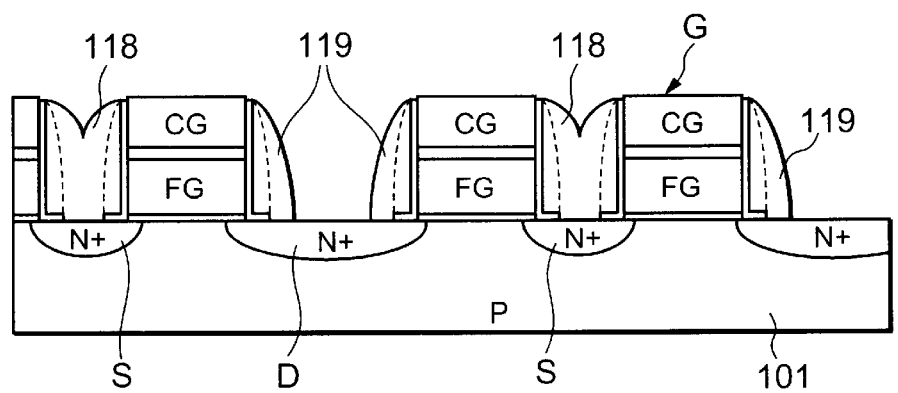
FIGS. 10A to 10D are cross-sectional views of a seventh process of a fabrication method of the an embodiment according to invention.
Figure 10B:
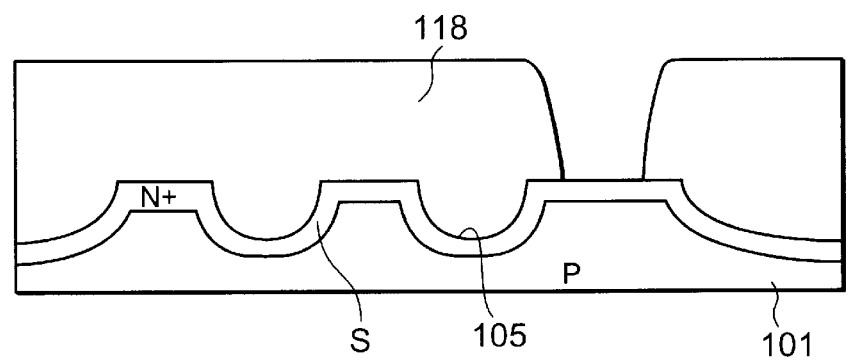
Figure 10C:
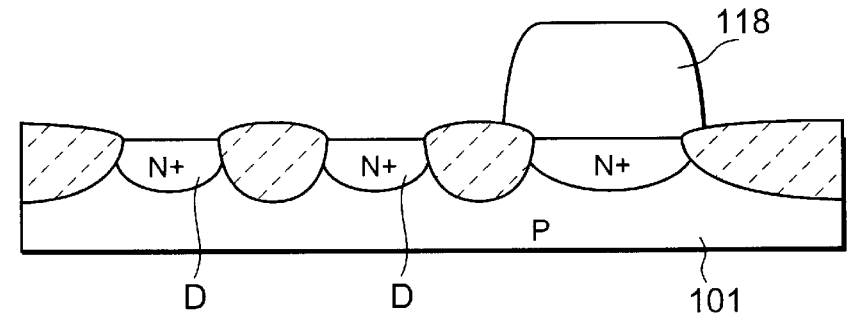
Figure 10D:
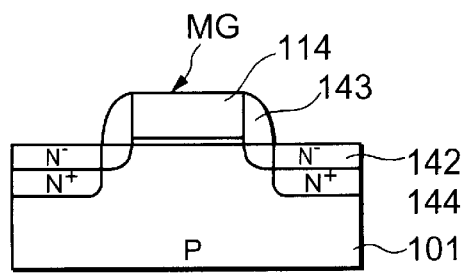
Figure 11A:
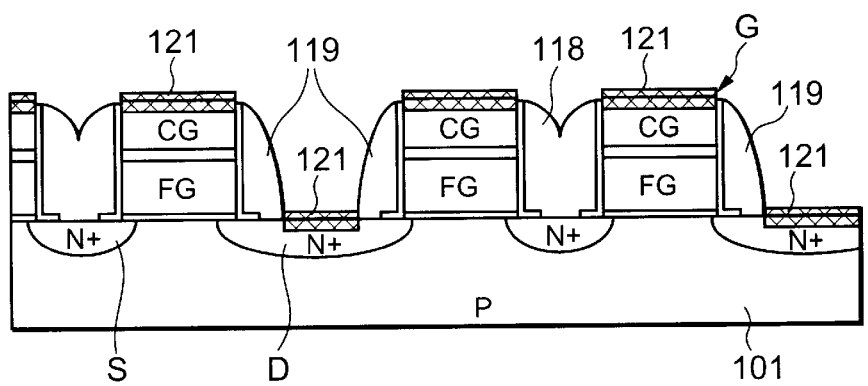
FIGS. 11A to 11D are cross-sectional views of an eighth process of a fabrication method of an embodiment according to the invention.
Figure 11B:
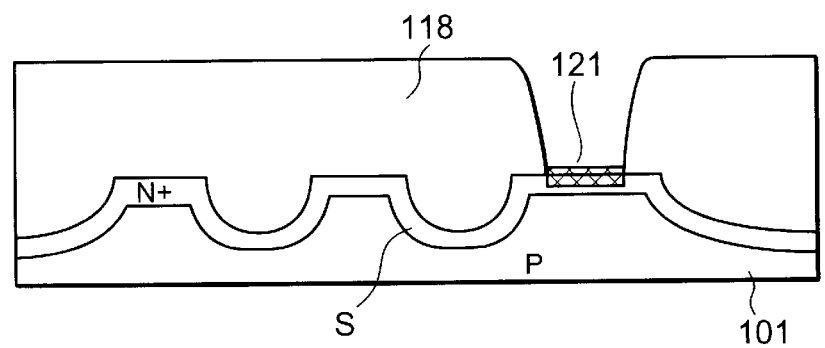
Figure 11C:
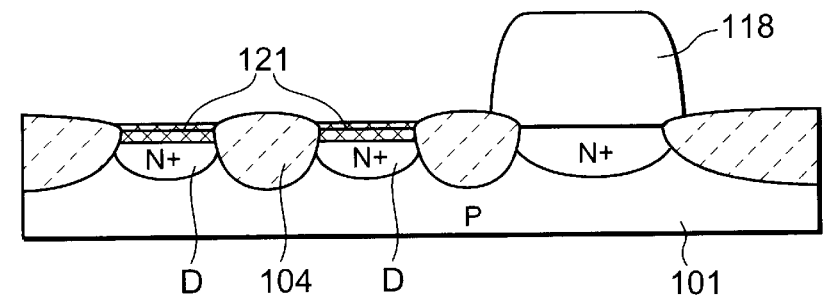
Figure 11D:
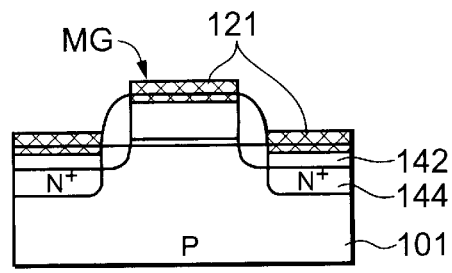
Figure 12:
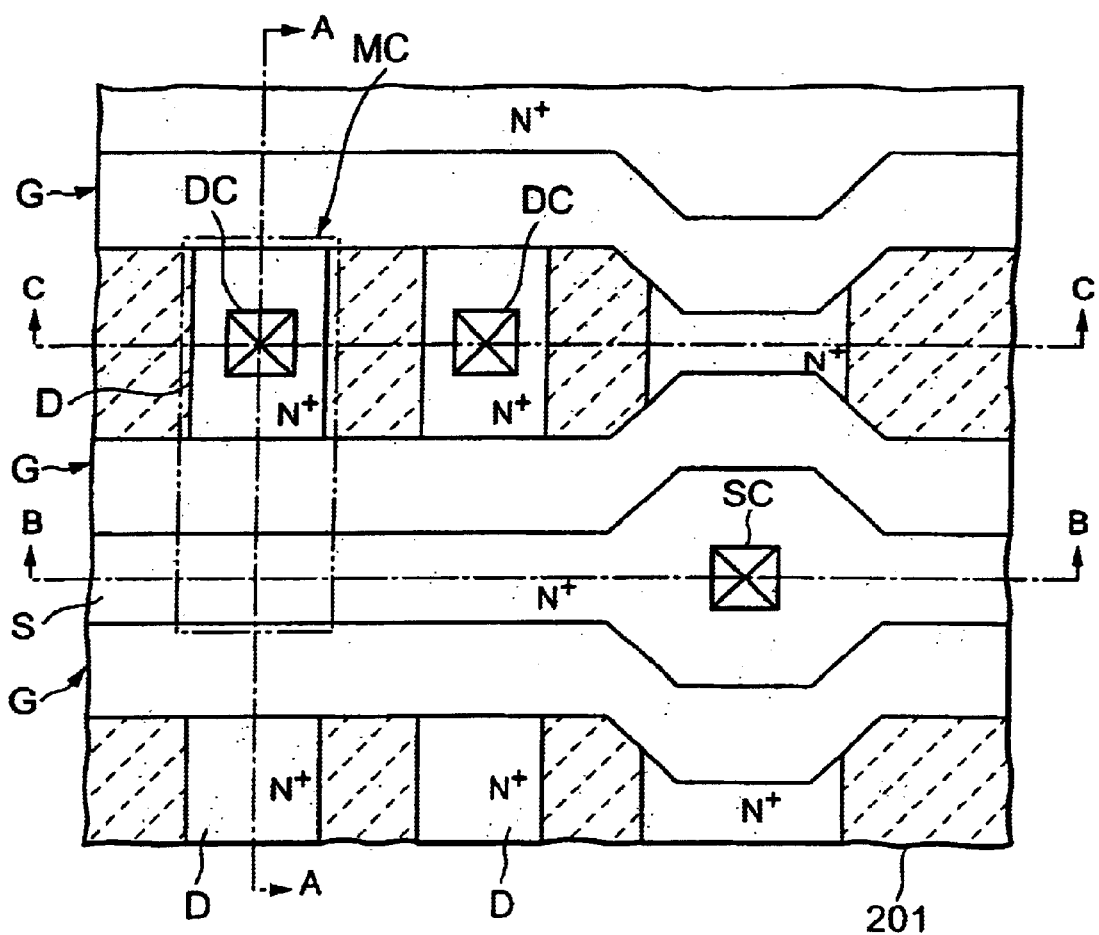
FIG. 12 is a plane layout view of a semiconductor memory device of a related art.
Figure 13A:
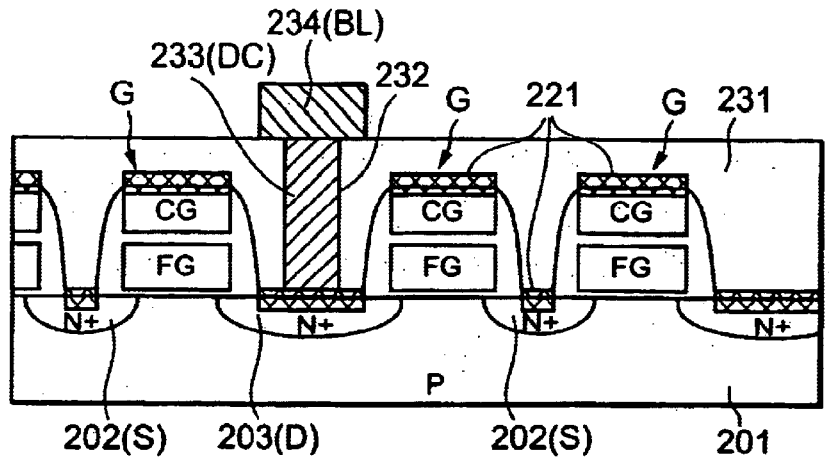
FIGS. 13A to C are cross-sectional views along the AA line, the BB line, and the CC line in FIG. 12, respectively.
Figure 13B:
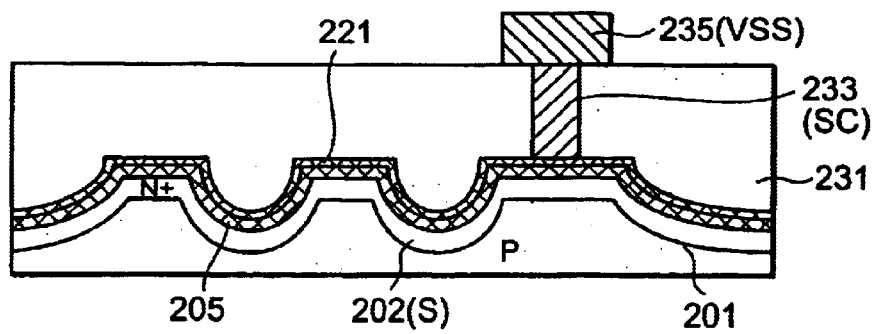
Figure 13C:
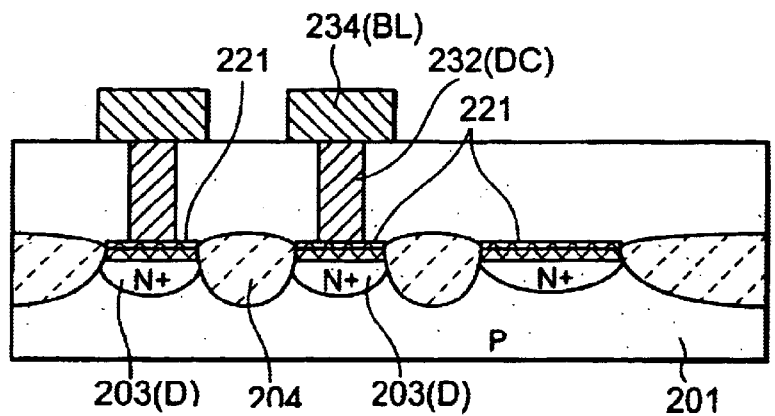
Figure 14:
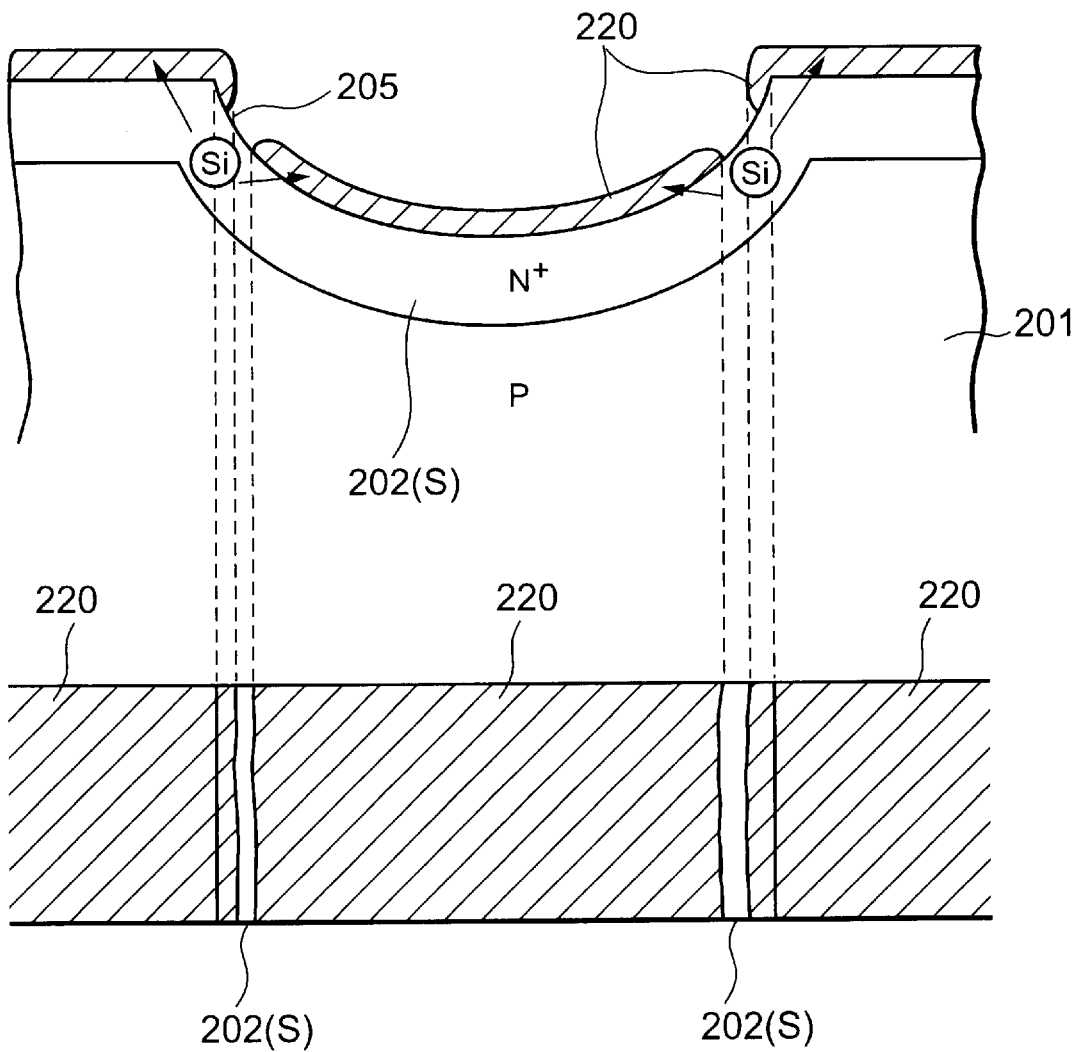
FIG. 14 is a schematic cross-sectional view of parts of source regions for illustrating the reason of increase of the source resistance in a semiconductor memory device of a related art.

On completion of the process, as shown in FIG. 9D, in the peripheral circuits where no fabrication step is performed yet, the second polysilicon 114 formed in the step shown in FIG. 6 is selectively etched to form gate electrodes MG of MOS transistors in the peripheral circuits to be formed in regions of the silicon substrate other than the regions where memory cells are formed. Further, utilizing the gate electrode MG, an impurity is implanted in a low concentration in the silicon substrate 101 of the peripheral circuits to form LDD regions 142.

Next, as shown in FIGS. 10A to 10D, a second CVD oxide film 118 is grown approximately 0.12 $\mu$m in the thickness by CVD method on memory cells and the peripheral circuits and then the grown second CVD oxide film 118 is etched back. Consequently, in the drain regions of the memory cells MC, second side walls formed by etching back the second CVD oxide film 118 are layered on the first side walls 117 and being united with the foregoing first side walls 117, the second side walls are formed to be side walls 119 as shown in FIG. 2A. Some parts of the drain regions D are exposed between the side walls 119. On the other hand, in the source regions S of the memory cells MC, at the time of growing the second CVD oxide film 118, the intervals between the first side walls 117, that is, the surface of source regions S, are filled with the second CVD oxide film 118 layered on the first side walls 117. For that, even if the second CVD oxide film 118 is etched back, the source regions S are kept as being covered with the first side walls 117 and the second CVD oxide film 118. However, in the regions of the dummy memory cells DMC, since the width of the gate electrodes G in the column direction is made narrow, the surface of the drain regions D is covered with the second CVD oxide film 118 also in the drain regions D, and in the regions of the dummy memory cells DMC, since the width of the gate electrodes G in the column direction is made wide in the source regions S, even if the second CVD oxide film 118 is formed, source regions S are exposed in almost the center part of the source regions S. Incidentally, the second side walls 143 are formed by the side faces of the gate electrodes MG of the peripheral circuits. Then, utilizing the second side walls 143, an impurity is implanted in a high concentration in the silicon substrate 101 of the peripheral circuits to form high concentration impurity diffusion layers 144 as source and drain regions. Consequently, MOS transistor with LDD structure can be fabricated.

Next, as shown in FIGS. 11A to 11D, cobalt is sputtered in approximately 10 to 20 nm film thickness in the entire surface and successively thermally treated (annealed) to cause siliciding reaction of the formed cobalt film and neighboring polysilicon of control gates CG and silicon of the drain regions D and the source regions S in self-alignment manner and form cobalt silicide layers (salicide layers) 121. However, in the drain regions D, the cobalt silicide layers 121 are formed in the regions sandwiched between the side walls 119 of drain regions D of the respective memory cells except in the regions of above-described dummy memory cells, whereas in the source regions S, the cobalt silicide layers 121 are formed only the exposed regions in the approximately center parts of the regions of the above-described dummy memory cells DMC and no cobalt silicide layer 121 is formed in the respective source regions S of the memory cells coated with the first side walls 117 and the second CVD oxide film 118. Incidentally, simultaneously with that, also in the peripheral circuits, the cobalt silicide layers 121 are formed on the gate electrodes MG and in the source and drain regions 144. After that, cobalt which is not reacted with the siliciding reaction is removed by etching to leave only cobalt silicide layers.

On completion of the process, as shown in FIGS. 2A to 2C, an interlayer insulation film 131 of TEOS or the like is formed on the entire surface and contact holes 132 are opened in the regions of the drain regions D where the cobalt silicide layers 121 are formed. Further, the contact holes 132 are opened same in the regions of the approximately center parts of the above-described width-widened regions of the source regions S where the cobalt silicide layers 121 are formed. A metal material 133 such as aluminum or the like is buried in the opened contact holes 132 to form drain contact electrodes DC and source contact electrodes SC. Further, wirings 134 as bit lines BL and wirings 135 as an electric power source VSS connected respectively to the drain contact electrodes DC and the source contact electrodes SC are formed on the interlayer insulation film 131. By the processes as described above, a non-volatile semiconductor memory device shown in FIG. 1 and FIGS. 2A to 2C can be completed.

In this fabrication method, in the process shown in FIGS. 9A to 9D, if the first side walls 117 are formed only for the memory cells MC, by carrying out the steps of forming the second side walls thereafter; a step of growing the second CVD oxide film 118 simultaneously with the step of forming the MOS transistors with LDD structure of the peripheral circuits and a step of etching back the film; it is made possible to coat only the surface of the source regions S with the above-described first side walls 117 and the second CVD oxide film 118. Consequently, as compared with the fabrication processes of such a conventional type of semiconductor memory devices, it is sufficient to add a step of forming the above-described first side walls 117 for the memory cells MC, and by adding only one step to conventional fabrication processes without altering the processes, a semiconductor memory device according to the invention can be fabricated. If a step of forming salicide for the memory cells and the peripheral circuits is carried out after the step of forming the first and the second side walls, especially in the memory cells MC, the cobalt silicide layers 121 can be formed on the control gates CG and in the drain regions D and on the other hand, no cobalt silicide layer 121 is formed in the source regions S to fabricate the memory cells MC shown in FIG. 1 to FIGS. 2A to 2C.

Consequently, as described above, when the element isolating insulation films 104 of the source regions S are removed by etching in the process shown in FIGS. 7A to 7D as to form NOR circuits by continuing the respective source regions S of the neighboring memory cells in the line direction, even if recessed parts 105 are formed between the neighboring memory cells as traces of removal of the element isolating insulation films 104, metal silicide layers similar to those in a conventional structure shown in FIG. 12 and FIGS. 13A to 13C are not formed in the source regions S and that makes it possible to avoid increase of the source resistance attributed to that the metal silicide layers are made disconnected by steep projected and recessed parts and that silicon atom of the source regions S is absorbed by the metal for the metal silicide. On the other hand, in the regions where the source contact electrodes SC, the intervals of the source regions S in the column direction are made wide and the cobalt silicide layers 121 can therefore be formed only in the source contact regions SC by the salicide formation step, so that the source contact resistance can be lowered.

Since the second side walls 143 formed in the MOS transistors of the peripheral circuits become LDD spacers of the MOS transistors of the peripheral circuits, the film thickness is set to be the optimum film thickness corresponding to the electric properties of the MOS transistors. On the other hand, the film thickness of the first side walls 117 does not affect the characteristics of the memory cells MC and may be set to be sufficient to bury the source regions S with the first side walls 117 and the second CVD oxide film 118 when the second CVD oxide film 118 is grown in order to form the side walls 119 in which the second side walls are layered.

Incidentally, in the description of the above-described embodiment, although simultaneous formation of the memory cells and the peripheral circuits is exemplified, the invention can be applied also to the case where only the memory cells are formed in an independent process. In such a case, it is no need to set the film thickness of the second side walls while taking the electric properties of the MOS transistors of the peripheral circuits into consideration, the film thickness of the first side walls can be set properly as to make the surface area of the cobalt silicide layers formed in the drain regions as wide as possible and on the other hand as to bury the source regions when the second CVD oxide films are formed to form the second side walls. Consequently, the drain resistance and the source contact resistance can be lowered.

Further, in the above-described embodiment, although the case where a cobalt silicide layer is employed as the metal silicide layer is exemplified, a titanium silicide layer or a tungsten silicide layer may be employed.

As described above, in the invention, since a metal silicide layer is formed only in some parts of the surface exposed in opening parts of interlayer insulation film in common source regions formed continuously in a plurality of projected and recessed parts formed on the surface of a semiconductor substrate, and especially since the source regions are so formed as to have the metal silicide layer only in source contact regions in a semiconductor memory device comprising with MOS type structure, even if projected and recessed parts exist in the surface of source regions, owing to that no metal silicide layer is formed on the projected and recessed parts, the metal silicide layer is not formed in disconnected state in the projected and recessed parts and the metal for forming the metal silicide layer does also not absorb silicon atom of the source regions to prevent increase of the electric resistance of the source regions. Further, on the other hand, since the metal silicide layer is formed in the regions where source contact electrodes are to be formed, the source contact resistance can be lowered.

Further, in the fabrication method of the invention, only by carrying out side wall formation two times, the source regions are buried with an insulation film and by carrying out the silicide formation step, fabrication of a semiconductor memory device having no metal silicide layer in the source regions is made easily possible. Further, in the case of forming memory cells and peripheral circuits simultaneously, if first side walls are formed only for the memory cells, by forming the peripheral circuits and second side walls simultaneously thereafter, only the surface of the source regions can be coated with an insulation film. Consequently, addition of only a step of forming the first side walls for memory cells to the fabrication processes of such a conventional semiconductor memory device makes fabrication of a semiconductor memory device of the invention easily possible without altering the conventional fabrication processes.

What is claimed is:

1. A semiconductor memory device comprising:
    a plurality of non-volatile memory cells each having a source region;
    a source impurity diffusion layer divided into a first portion and a second portion extended from said first portion, said first portion being said source regions of said memory cells so that no silicide film is formed on said first portion,
    an insulating film formed on said source impurity diffusion layer and having at least one source contact hole, said source contact hole defining said second portion;
    a silicide layer formed on said second portion; and
    a source contact formed on said silicide layer.

2. The device as claimed in claim 1, said device further comprising a dummy cell comprising a drain region and a source region so that said second portion is said source region of said dummy cell, no silicide layer being formed on said drain region of said dummy cell.

3. A semiconductor memory device comprising:

a first non-volatile memory cell having a first source region;

a second non-volatile memory cell having a second source region;

a source impurity diffusion layer divided into a first portion, a second portion and a third portion between said first and second portions, said first portion being said first source region and said second portion being said second source region;

an insulating film formed on said source impurity diffusion layer and having at least one source contact hole, said source contact hole defining said third portion;

a suicide layer formed on said third portion and not formed on said first and second portions; and a source contact connected to said third portion through said silicide layer.

4. The device as claimed in claim 3, said device further comprising a dummy cell arranged between said first and second non-volatile memory cell, said dummy cell having a source region and a drain region, said third portion being said source region of said dummy cell, no silicide layer being formed on said drain region of dummy cell.

5. A semiconductor memory device comprising:

a semiconductor substrate having a plurality of projected and recessed parts in the surface;

a source region continuously formed on said projected and recessed parts of the semiconductor substrate to cover said projected and recessed parts, said source region running in a first direction;

an interlayer insulation film having an opening of at least one source contact hole exposing a part of the surface of said source region so that no silicide layer is formed between said interlayer insulating film and said source region without said opening; and a metal silicide layer covering said opening of said source region.

6. The device as claimed in claim 5, said device further comprising a plurality of drain regions arranged in said first direction, each of said drain regions being arranged in a line perpendicular to said first direction with a corresponding one of said projected parts of said source region, said metal silicide layer being formed on said drain regions, and an impurity diffusion layer having the same conductivity of said drain regions, said impurity diffusion layer being arranged in a line along said first direction with said drain regions and being arranged in a line perpendicular to said opening so that no suicide layer is formed on said impurity diffusion layer.

* * * * *

UNITED STATES PATENT AND TRADEMARK OFFICE
CERTIFICATE OF CORRECTION

PATENT NO. : 6,747,321 B2
DATED : June 8, 2004
INVENTOR(S) : K. Kanamori

It is certified that error appears in the above-identified patent and that said Letters Patent is hereby corrected as shown below:

<u>Title page,</u>
Item [30], Foreign Application Priority Data, after "(22) Filed: Dec. 17, 2001" add
-- (30)   Foreign Application Priority Data
          Dec. 20, 2000 (JP)…………. 2000-386932 --

Signed and Sealed this

Seventh Day of September, 2004

JON W. DUDAS
*Director of the United States Patent and Trademark Office*